(12) United States Patent
Kim

(10) Patent No.: US 7,989,832 B2
(45) Date of Patent: Aug. 2, 2011

(54) LIGHT EMITTING DEVICE AND MANUFACTURING METHOD THEREOF

(75) Inventor: Kyong Jun Kim, Gwangju-si (KR)

(73) Assignee: LG Innotek Co., Ltd, Seoul (KR)

( * ) Notice: Subject to any disclaimer, the term of this patent is extended or adjusted under 35 U.S.C. 154(b) by 782 days.

(21) Appl. No.: 11/856,303

(22) Filed: Sep. 17, 2007

(65) Prior Publication Data

US 2008/0067497 A1   Mar. 20, 2008

(30) Foreign Application Priority Data

Sep. 18, 2006   (KR) .................. 10-2006-0089996

(51) Int. Cl.
*H01L 33/00* (2010.01)

(52) U.S. Cl. ............ 257/98; 257/13; 257/14; 257/79; 257/81; 257/86; 257/94; 257/99; 257/103; 257/E33.001; 257/E33.028; 257/E33.029

(58) Field of Classification Search ............ 257/98
See application file for complete search history.

(56) References Cited

U.S. PATENT DOCUMENTS

| | | | |
|---|---|---|---|
| 6,465,808 B2 * | 10/2002 | Lin ................... | 257/81 |
| 6,958,494 B2 * | 10/2005 | Lin et al. ............ | 257/86 |
| 7,187,007 B2 * | 3/2007 | Kim et al. ........... | 257/79 |
| 7,279,716 B2 * | 10/2007 | Chen .................. | 257/94 |
| 2003/0059971 A1 * | 3/2003 | Chua et al. .......... | 438/46 |
| 2004/0089868 A1 * | 5/2004 | Hon et al. ........... | 257/79 |
| 2005/0017254 A1 * | 1/2005 | Lin et al. ............ | 257/81 |
| 2005/0092980 A1 * | 5/2005 | Chen et al. .......... | 257/14 |
| 2005/0236636 A1 * | 10/2005 | Hon et al. ........... | 257/99 |
| 2005/0285125 A1 * | 12/2005 | Kim et al. ........... | 257/94 |
| 2006/0006375 A1 * | 1/2006 | Ou et al. ............. | 257/14 |
| 2006/0006407 A1 * | 1/2006 | Kim et al. ........... | 257/103 |
| 2006/0043396 A1 * | 3/2006 | Tsuda et al. ......... | 257/94 |
| 2006/0054897 A1 * | 3/2006 | Yu et al. ............. | 257/79 |
| 2006/0054907 A1 * | 3/2006 | Lai .................... | 257/96 |
| 2006/0096942 A1 * | 5/2006 | Lane ................... | 215/10 |
| 2006/0102921 A1 * | 5/2006 | Wu et al. ............. | 257/99 |
| 2007/0080352 A1 * | 4/2007 | Wu et al. ............. | 257/79 |
| 2007/0080369 A1 * | 4/2007 | Sakai .................. | 257/103 |
| 2007/0108457 A1 * | 5/2007 | Lai et al. ............ | 257/94 |
| 2007/0108459 A1 * | 5/2007 | Lu ..................... | 257/98 |
| 2007/0116916 A1 * | 5/2007 | Ito et al. ............ | 428/46 |
| 2007/0120141 A1 * | 5/2007 | Moustakas et al. ..... | 257/103 |
| 2007/0145351 A1 * | 6/2007 | Kawaguchi ............ | 257/14 |
| 2007/0148923 A1 * | 6/2007 | Kim et al. ........... | 438/483 |
| 2007/0172973 A1 * | 7/2007 | Yoo ................... | 438/28 |
| 2007/0187713 A1 * | 8/2007 | Kim ................... | 257/103 |
| 2007/0194325 A1 * | 8/2007 | Sung et al. .......... | 257/79 |
| 2007/0202624 A1 * | 8/2007 | Yoon et al. .......... | 438/29 |
| 2007/0241321 A1 * | 10/2007 | Kuo et al. ........... | 257/13 |
| 2007/0241352 A1 * | 10/2007 | Yasuda et al. ........ | 257/94 |
| 2008/0029773 A1 * | 2/2008 | Jorgenson ............ | 257/94 |
| 2008/0157115 A1 * | 7/2008 | Chuang et al. ........ | 257/99 |
| 2008/0315178 A1 * | 12/2008 | Kim ................... | 257/13 |
| 2009/0206320 A1 * | 8/2009 | Chua et al. .......... | 257/13 |
| 2009/0302308 A1 * | 12/2009 | Chua et al. .......... | 257/13 |

* cited by examiner

*Primary Examiner* — Leonardo Andújar
*Assistant Examiner* — William Harriston
(74) *Attorney, Agent, or Firm* — Birch, Stewart, Kolasch & Birch, LLP

(57) ABSTRACT

Disclosed are a light emitting device and a manufacturing method thereof. The light emitting device comprises a first conductive semiconductor layer, an active layer on the first conductive semiconductor, a second conductive semiconductor layer on the active layer, and a dot-shaped roughness layer on the second conductive semiconductor layer.

18 Claims, 5 Drawing Sheets

LIGHT EMITTING DEVICE AND MANUFACTURING METHOD THEREOF

The present application claims priority under 35 U.S.C. 119 and 35 U.S.C. 365 to Korean Patent Application No. 10-2006-0089996 (filed on Sep. 18, 2006), which is hereby incorporated by reference in its entirety.

BACKGROUND

A III-V group nitride semiconductor has been variously used for an optical device such as blue/green LEDs (light emitting diodes), a high speed switching device such as a MOSFET (metal semiconductor field effect transistor) and a HEMT (hetero junction field effect transistor), light source of an illumination or a display apparatus, and the like. In particular, a light emitting device using an III group nitride semiconductor has a direct transition-type bandgap corresponding to the range of visible rays to ultraviolet rays, and can perform high efficient light emission.

The nitride semiconductor has been mainly utilized as a LED or a LD (laser diode), and research for improving the manufacturing process or light efficiency had been conducted.

GaN is representatively used as the III-V group nitride semiconductor. Such a nitride semiconductor is grown on a substrate through crystal growth. Further, the nitride semiconductor is activated into a p-type semiconductor or an n-type semiconductor according to the type of dopants, thereby forming a P-N junction device or an N-P-N junction device.

The biggest problem in determining the light emission efficiency of the LED is that the external quantum efficiency is low. The external quantum efficiency represents efficiency for emitting light, which is generated from an active layer, to an exterior. A part of the light generated in the active layer is not emitted to an exterior due to refraction index difference in the boundary of a semiconductor layer, and travels in the LED and then attenuated due to total internal reflection. Various methods for improving the external quantum efficiency have been proposed to solve such a problem.

SUMMARY

The embodiment provides a light emitting device capable of maximizing the external quantum efficiency, and a manufacturing method thereof.

The embodiment provides a light emitting device capable of improving the external quantum efficiency by growing the last conductive semiconductor layer to have a roughness surface, and a manufacturing method thereof.

An embodiment provides a light emitting device comprising: a first conductive semiconductor layer; an active layer on the first conductive semiconductor; a second conductive semiconductor layer on the active layer; and a dot-shaped roughness layer on the second conductive semiconductor layer.

An embodiment provides a light emitting device comprising: a first conductive semiconductor layer; an active layer on the first conductive semiconductor; a second conductive semiconductor layer on the active layer; a roughness layer comprising indium on the second conductive semiconductor layer; and a third conductive semiconductor layer on the roughness layer.

An embodiment provides a method for manufacturing a light emitting device, the method comprising the steps of: forming a first conductive semiconductor layer; forming an active layer on the first conductive semiconductor; forming a second conductive semiconductor layer on the active layer; forming a roughness layer using indium on the second conductive semiconductor layer; and forming a third conductive semiconductor layer on the roughness layer.

DETAILED DESCRIPTION OF THE EMBODIMENTS

Hereinafter, a light emitting device and a manufacturing method thereof according to embodiments will be described with reference to the accompanying drawings.

Figure 1:
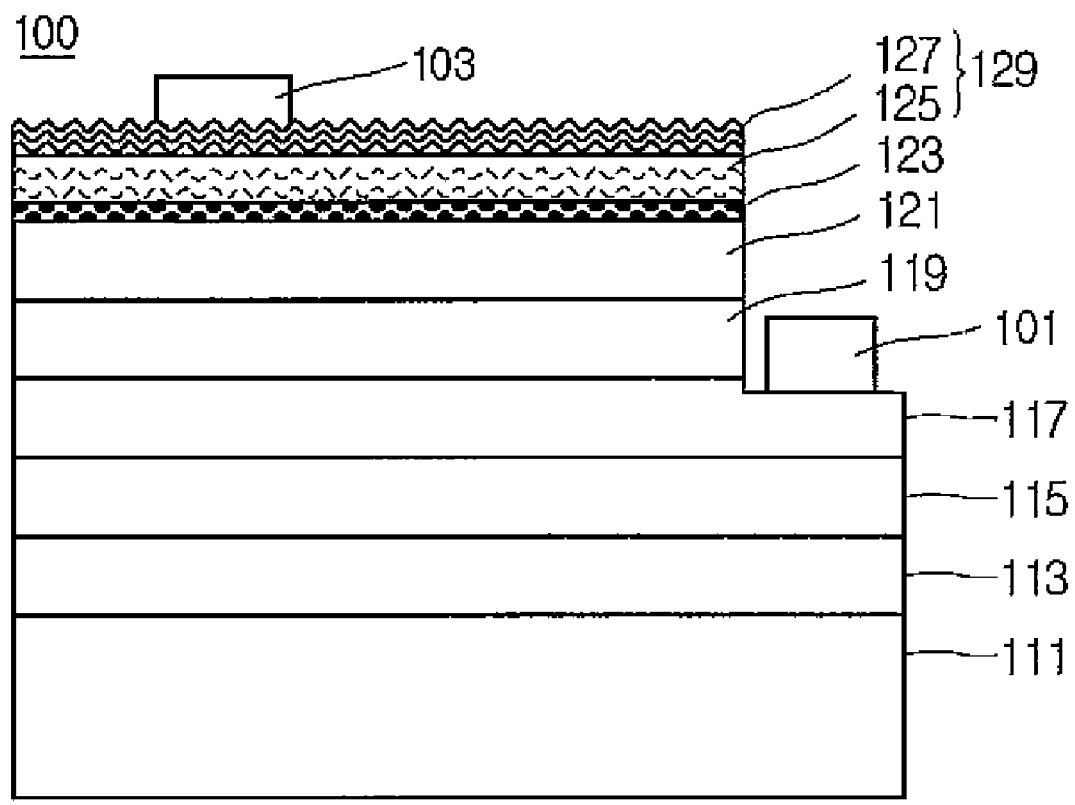
FIG. 1 is a sectional view showing a light emitting device according to a first embodiment.

FIG. 1 is a sectional view showing a light emitting device according to a first embodiment and FIGS. 2 to 6 are sectional views sequentially showing the procedure for manufacturing the light emitting device according to the first embodiment.

Referring to FIG. 1, the light emitting device 100 comprises a substrate 111, a buffer layer 113, an undoped semiconductor layer 115, a first conductive semiconductor layer 117, an active layer 119, a second conductive semiconductor layer 121, a roughness layer 123, and a third conductive semiconductor layer 129.

The buffer layer 113 is formed on the substrate 111, the undoped semiconductor layer 115 is formed on the buffer layer 113, and the first conductive semiconductor layer 117, the active layer 119 and the second conductive semiconductor layer 121 are formed on the undoped semiconductor layer 115. The roughness layer 123 and the third conductive semiconductor layer 129 are formed on the second conductive semiconductor layer 121, in which the roughness layer 123 comprises indium and has a dot shape.

The substrate 111 is selected from the group consisting of $Al_2O_3$, GaN, SiC, ZnO, GaP, GaAs and Si.

Figure 2:
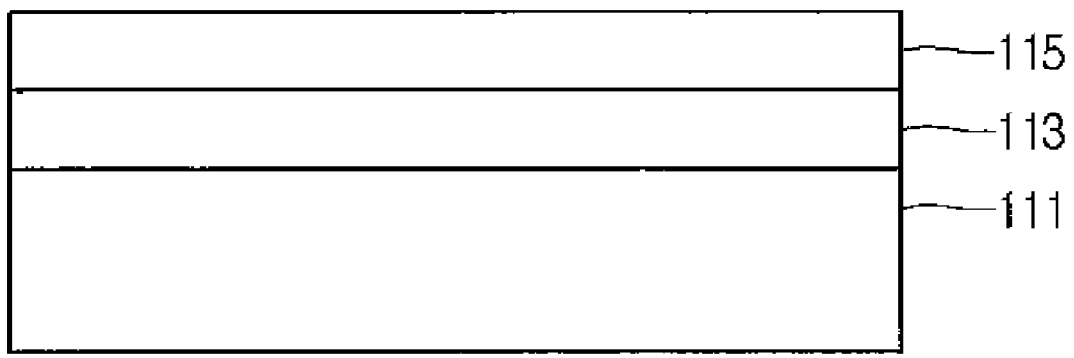
FIGS. 2 to 6 are sectional views sequentially showing the procedure for manufacturing a light emitting device according to a first embodiment.

As shown in FIG. 2, the buffer layer 113 is formed on the substrate 111. The buffer layer 113 reduces the lattice constant difference between the substrate 111 and the GaN semiconductor layer. For example, the buffer layer 113 can be selectively formed from GaN, AlN, AlGaN, InGaN and AlInGaN.

The undoped semiconductor layer 115 having no dopant is formed on the butter layer 113. In order to form the undoped semiconductor layer 115, for example, $NH_3$ and TMGa are supplied onto the buffer layer 113 at the predetermined growth temperature, so that the undoped GaN layer having a predetermined thickness is formed. In the embodiment, at least one of buffer layer 113 and the undoped semiconductor layer 115 may be formed. Further, the two layers may also be removed or may not be formed.

Figure 3:
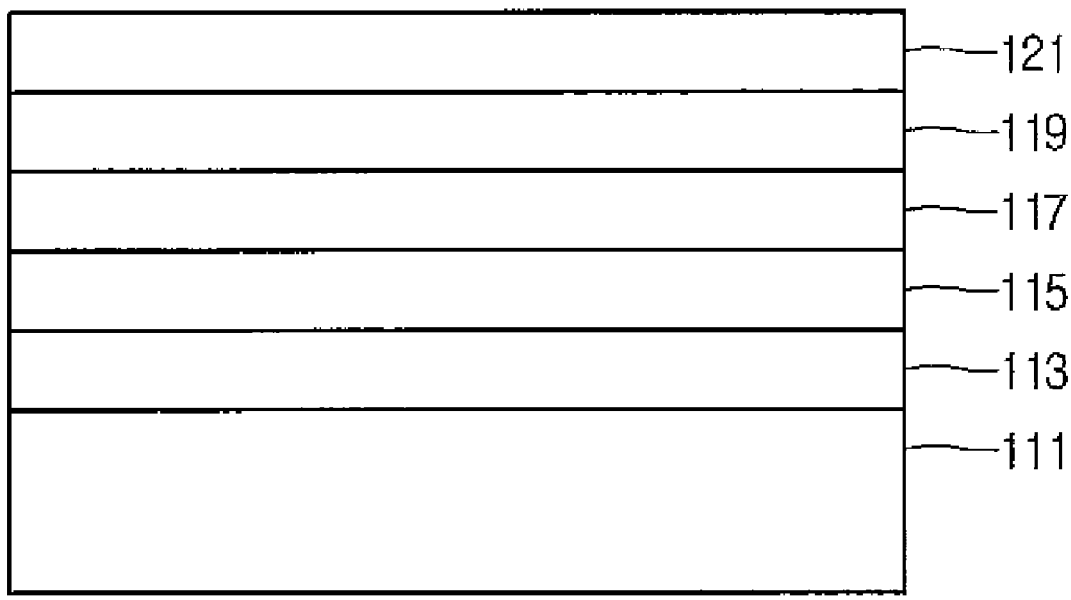

As shown in FIG. 3, the first conductive semiconductor layer 117 is formed on the undoped semiconductor layer 115. The first conductive semiconductor layer 117 may comprise an n-type semiconductor layer. The n-type semiconductor layer comprises at least one selected from the group consisting of GaN, AlGaN, InGaN, InN, AlN and InAlGaN, and is doped with n-type dopant such as Si, Ge, Sn, Se and Te.

The active layer 119 having a single quantum well structure or a multiple quantum well structure is formed on the first conductive semiconductor layer 117. In order to form the active layer 119, for example, carrier gas $NH_3$ and source gas TMGa and TMIn are supplied at the predetermined growth temperature, so that the active layer comprising InGaN/GaN is formed.

The second conductive semiconductor layer 121 is formed on the active layer 119. The second conductive semiconductor layer 121 may comprise a p-type semiconductor layer. The p-type semiconductor layer comprises at least one selected from the group consisting of GaN, GaN, InN, AlN, InGaN, AlGaN and InAlGaN, and is doped with p-type dopant such as Mg, Be and Zn. In this way, such a second conductive semiconductor layer 121 having a thickness of several hundreds of Å to several thousands of Å can be grown. The embodiment is not limited thereto.

Figure 4:
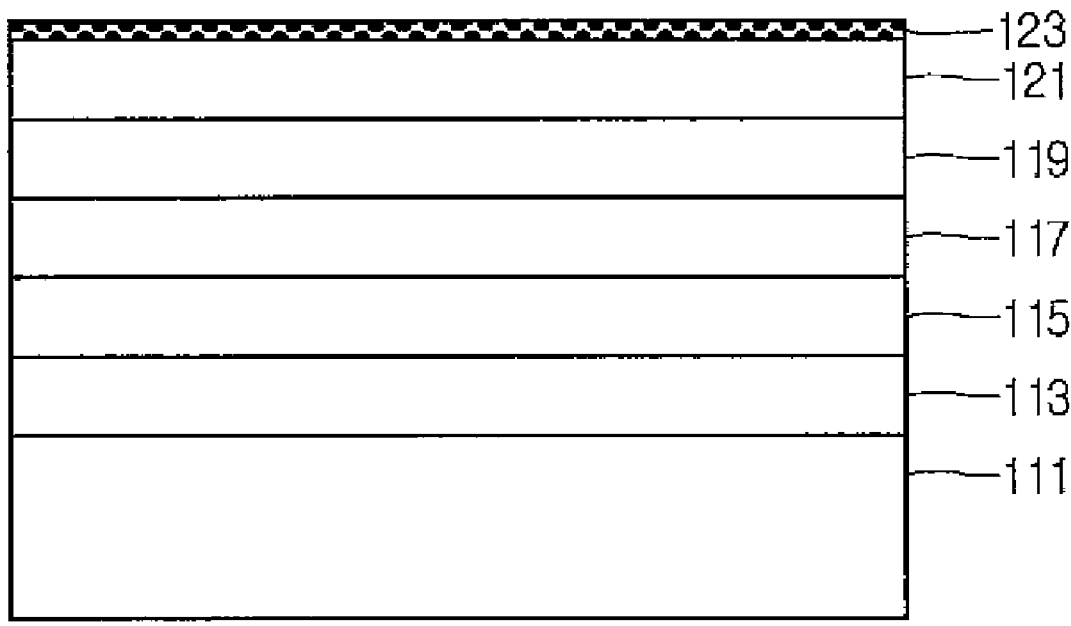

As shown in FIG. 4, the roughness layer 123 using indium is formed on the second conductive semiconductor layer 121. In order to form the roughness layer 123, for example, source gas TMIn for indium is supplied for 1 second to 100 seconds at the growth temperature of 500° C. to 800° C. in a growth chamber, so that the indium is deposited with a dot shape. The roughness layer 123 deposited on the second conductive semiconductor layer 121 is a dot-shaped layer and has a thickness of 1000 Å to 1900 Å.

Figure 5:
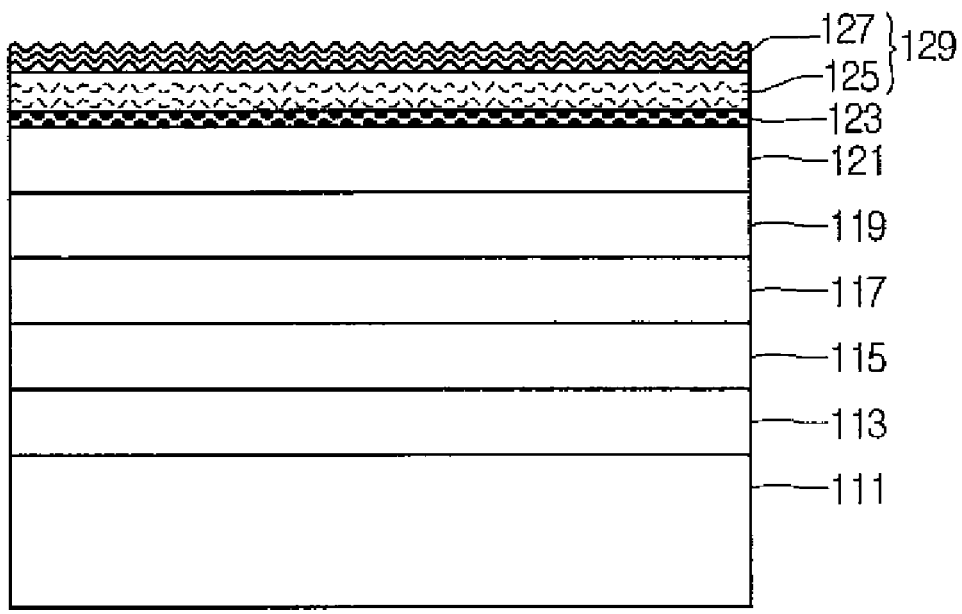

As shown in FIG. 5, the third conductive semiconductor layer 129 is formed on the roughness layer 123. The third conductive semiconductor layer 129 may comprise a plurality of n-type semiconductor layers. The n-type semiconductor layer, for example, comprises an n-type InGaN clad layer 125 and an n-type $Al_x(Ga_{1-x})In_{1-y}N$ layer 127, in which $0 \leq x \leq 1$ and $0 \leq y \leq 1$. For example, source gas, such as $NH_3$, TMGa, TEGa or TMIn, and n-type dopant (e.g. Si) are supplied to form the n-type InGaN clad layer 125. At this time, the n-type InGaN clad layer 125 has a thickness of 10 nm or less (e.g. 1 nm to 10 nm). Such an n-type InGaN clad layer 125 is formed on the roughness layer 123 having a dot shape, so that the n-type InGaN clad layer 125 has a dot-shaped roughness surface.

The n-type dopant (e.g. Si) is over-doped on the n-type InGaN clad layer 125 to form the n-type $Al_x(Ga_{1-x})In_{1-y}N$ layer 127 ($0 \leq x \leq 1$, $0 \leq y \leq 1$) having a thickness of 100 nm or less (e.g. 1 nm to 100 nm). The n-type $Al_x(Ga_{1-x})In_{1-y}N$ layer 127 is doped with the n-type dopant (e.g. Si) with the density of $1 \times 10^{18}/cm^3$ or more.

The n-type InGaN clad layer 125 functions as a first cap layer that protects the dot-shaped roughness layer 123 and the n-type $Al_x(Ga_{1-x})In_{1-y}N$ layer 127 functions as a second cap layer.

In a case in which the n-type dopant is over-doped in the n-type $Al_x(Ga_{1-x})In_{1-y}N$ layer 127, the vertical growth of the n-type semiconductor layer is facilitated. Accordingly, the third conductive semiconductor layer 129 has a roughness surface formed on the dot-shaped surface of the roughness layer 123. The roughness surface of the third conductive semiconductor layer 129 reduces the contact resistance, improves the electrical properties, and increases the surface area, so that the external quantum efficiency can be improved.

Further, the n-type $Al_x(Ga_{1-x})In_{1-y}N$ layer 127 may comprise a semiconductor layer satisfying the inequality $0 \leq x \leq 1$ and $0 \leq y \leq 1$. For example, the n-type $Al_x(Ga_{1-x})In_{1-y}N$ layer 127 may comprise a superlattice layer (e.g. AlGaInN/InGaN, InGaN/AlGaN) in which at least one layer or two layers selected from the group consisting of AlInGaN, InGaN, AlGaN, GaN, AlInN, AlN and InN are alternatively formed.

A transparent electrode layer (not shown) may be formed on the third conductive semiconductor layer 129. The transparent electrode layer may be selected from the group consisting of ITO, ZnO, IrOx, RuOx and NiO.

Figure 6:
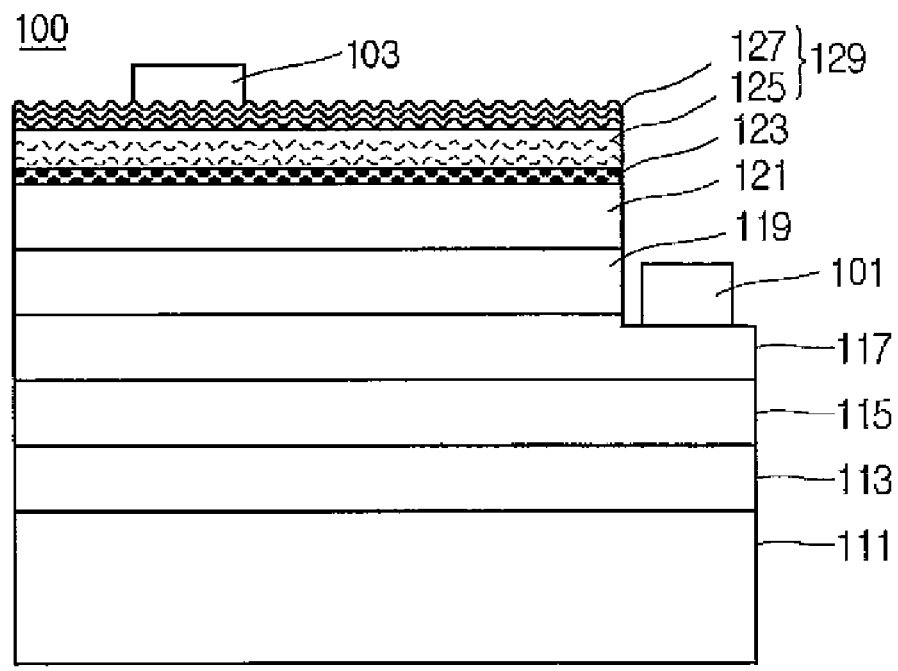

As shown in FIG. 6, the layers from the third conductive semiconductor layer 129 to the first conductive semiconductor layer 117 are partially mesa etched to expose a part of the first conductive semiconductor layer 117. Then, a first electrode 101 is formed on the first conductive semiconductor layer 117 and a second electrode 103 is formed on the third conductive semiconductor layer 129.

Figure 7:
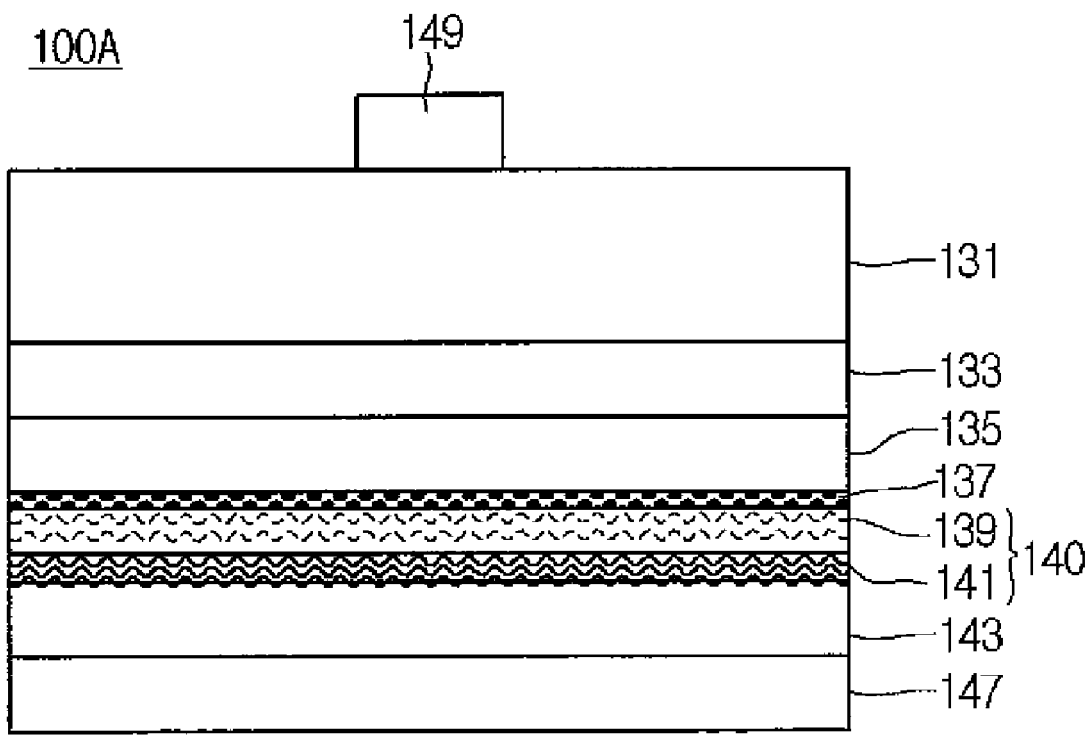
FIG. 7 is a sectional view showing a light emitting device according to a second embodiment.
Figure 8:
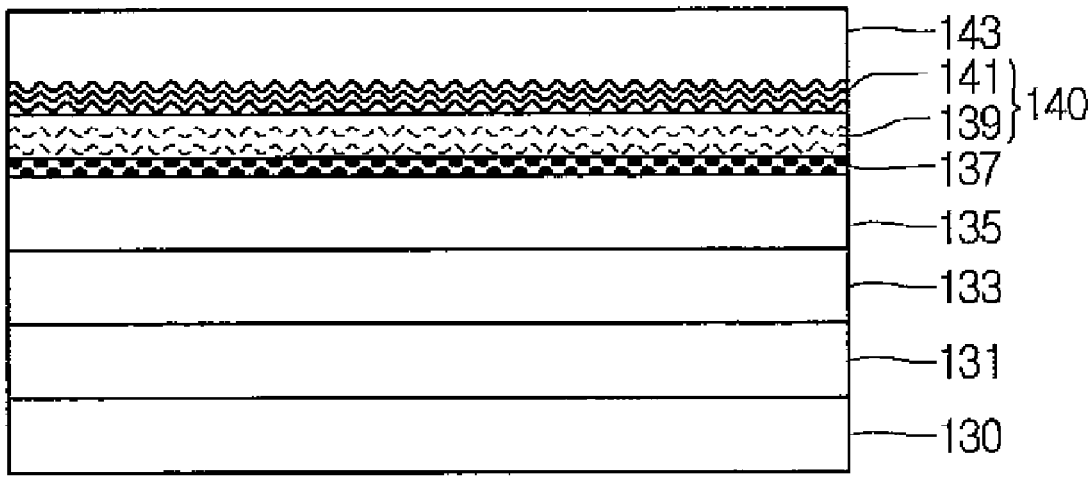
FIGS. 8 to 10 are sectional views sequentially showing the procedure for manufacturing a light emitting device according to a second embodiment.
Figure 9:
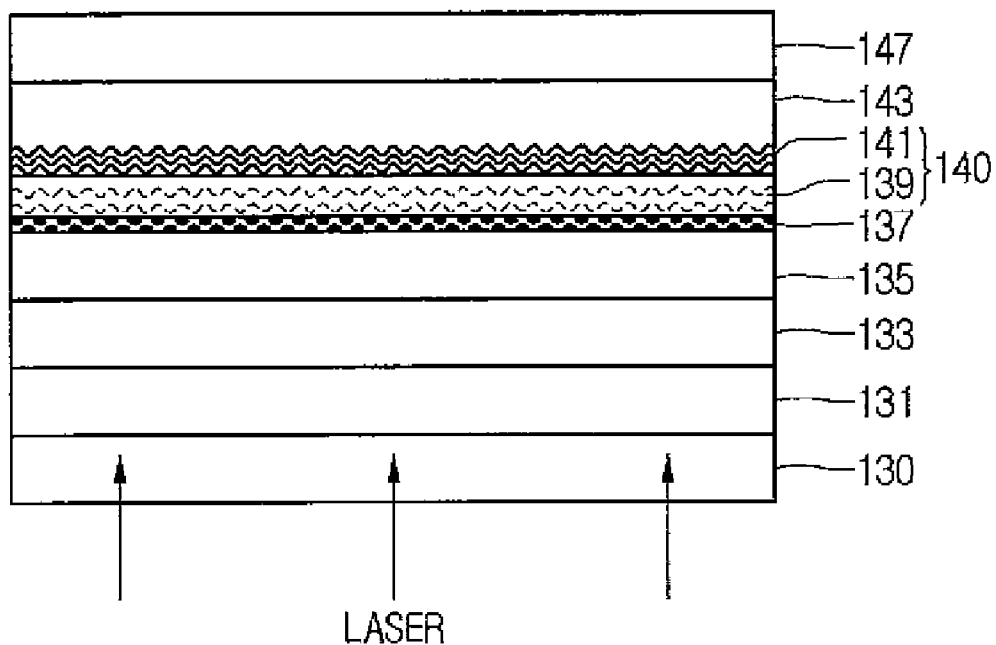
Figure 10:
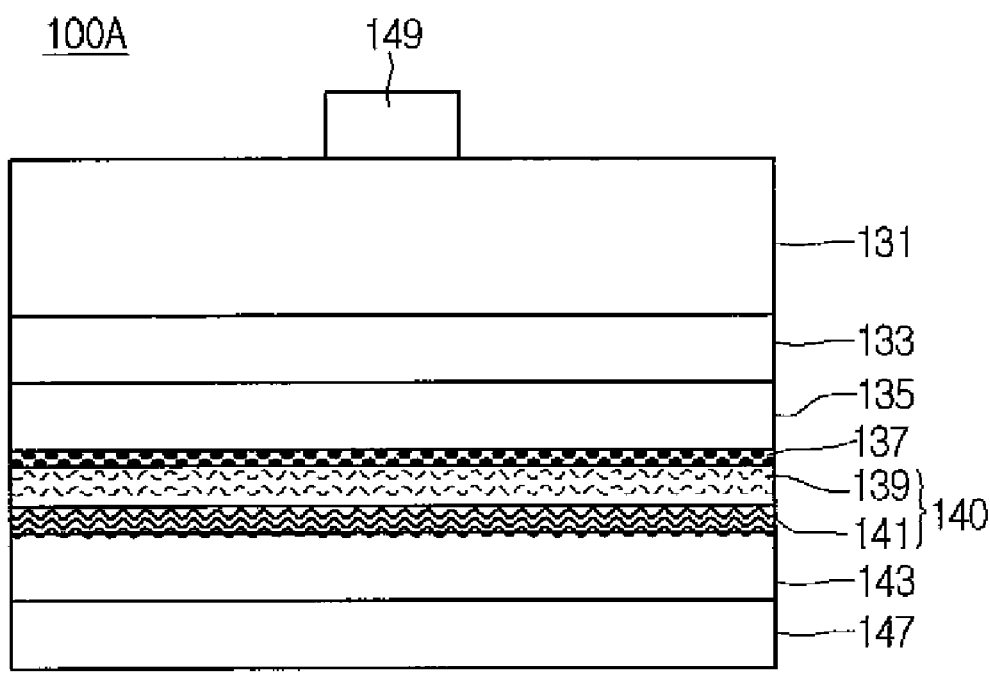

FIG. 7 is a sectional view showing a light emitting device according to a second embodiment and FIGS. 8 to 10 are sectional views sequentially showing the procedure for manufacturing the light emitting device according to the second embodiment. In the second embodiment, the description about elements and functions identical to those of the first embodiment will be omitted in order to avoid redundancy.

Referring to FIG. 7, the light emitting device 100A comprises a first conductive semiconductor layer 131, an active layer 133, a second conductive semiconductor layer 135, a roughness layer 137 using indium, a third conductive semiconductor layer 140, a second electrode layer 143, a conductive support substrate 147, and a first electrode 149.

As shown in FIG. 8, the first conductive semiconductor layer 131, the active layer 133 and the second conductive semiconductor layer 135 are sequentially formed on a substrate 130. Further, a layer, such as a buffer layer or/and an undoped semiconductor layer, may also be formed between the substrate 130 and the first conductive semiconductor layer 131.

The dot-shaped roughness layer 137 using indium is formed on the second conductive semiconductor layer 135, and the third conductive semiconductor layer 140 comprising an n-type InGaN clad layer 139 and an n-type $Al_x(Ga_{1-x})In_{1-y}N$ layer 141 is formed on the roughness layer 137, in which $0 \leq x \leq 1$ and $0 \leq y \leq 1$. The roughness layer 137 and the third conductive semiconductor layer 140 refers to the first embodiment, and detailed description thereof will be omitted. The roughness layer 137 using the indium and the third conductive semiconductor layer 140 on the roughness layer 137 have a roughness surface, so that the external quantum efficiency can be improved.

The first and third conductive semiconductor layers 131 and 140 may comprise an n-type semiconductor layer, and the second conductive semiconductor layer 135 may comprise a p-type semiconductor layer.

The second electrode layer 143 is formed on the third conductive semiconductor layer 140. Such a second electrode layer 143 is a p-type electrode layer and has a roughness surface formed on the surface of the third conductive semiconductor layer 140. The second electrode layer 143 may comprise at least one layer including material selected from the group consisting of Ag, Ni, Al, Rh, Pd, Ir, Ru, Mg, Zn, Pt, Au and Hf, and combinations thereof. Further, the second electrode layer 143 may also comprise a reflective electrode and a transparent electrode.

As shown in FIG. 9, the conductive support substrate 147 is formed on the second electrode layer 143. The conductive support substrate 147 can be attached to the second electrode layer 143 by using conductive adhesive (not shown). Such a conductive support substrate 147 may comprise cupper or/and gold and can be formed by plating a material on copper or through a wafer bonding technology.

After the conductive support substrate 147 is formed, the substrate 130 can be removed using a mechanical method or/and a physical method, e.g. an LLO (laser lift off) method using laser. That is, the substrate 130 under the first conductive semiconductor layer 131 is removed. Further, in a case in which a buffer layer or/and an undoped semiconductor layer has been formed between the substrate 130 and the first conductive semiconductor layer 131, such the buffer layer or/and the undoped semiconductor layer is/are also removed using a physical method or/and a chemical method, e.g. an etching method.

As shown in FIG. 10, the conductive support substrate 147 is located at a base, and then the first electrode 149 is formed on the first conductive semiconductor layer 131. Accordingly, the light emitting device 100A according to the second embodiment is manufactured.

In the first and second embodiments, a compound semiconductor light emitting device having an N-P-N junction structure is described as an example. However, the embodiment can also be applied to a compound semiconductor light emitting device having an N-P structure or a P-N-P structure. In the description about the elements of the embodiment, the position "on/under" is described based on the drawing, and the position "on/under" may change depending on locations of the elements.

It will be understood that when an element is referred to as being 'on' or "under" another element, it can be directly on/under the element, and one or more intervening elements may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a first conductive semiconductor layer;
   an active layer on the first conductive semiconductor;
   a second conductive semiconductor layer on the active layer;
   a roughness layer, including a dot shape, on the second conductive semiconductor layer;
   a third conductive semiconductor layer on the roughness layer; and
   a second electrode on the third conductive semiconductor layer,
   wherein the roughness layer is disposed between the third conductive semiconductor layer and the second conductive semiconductor layer,
   wherein the third conductive semiconductor layer is disposed between the second electrode and the roughness layer, and
   wherein the third conductive semiconductor layer has a rough surface, and
   wherein a polarity of the third conductive semiconductor layer is opposite to a polarity of the second conductive semiconductor layer.

2. The light emitting device as claimed in claim 1, wherein the first conductive semiconductor layer comprises an n-type semiconductor layer and the second conductive semiconductor layer comprises a p-type semiconductor layer.

3. The light emitting device as claimed in claim 1, comprising at least one of an undoped semiconductor layer, a buffer layer and a substrate under the first conductive semiconductor layer.

4. The light emitting device as claimed in claim 1, comprising a first electrode electrically connected to the first conductive semiconductor layer.

5. The light emitting device as claimed in claim 1,
   wherein the third conductive semiconductor layer comprises a plurality of n-type semiconductor layers, and
   wherein the plurality of n-type semiconductor layers comprise an n-type clad layer on the roughness layer, and an n-type $Al_x(Ga_{1-x})In_{1-y}N$ layer on the n-type clad layer, wherein $0 \leq x \leq 1$ and $0 \leq y \leq 1$.

6. The light emitting device as claimed in claim 1,
   wherein the third conductive semiconductor layer comprises an n-type clad layer on the roughness layer, and a superlattice layer on the n-type clad layer, and
   wherein the superlattice layer comprises at least two layers alternatively stacked, the at least two layers selected from the group consisting of AlInGaN, InGaN, GaN, AlInN and AlN.

7. The light emitting device as claimed in claim 5, wherein the n-type $Al_x(Ga_{1-x})In_{1-y}N$ layer of the third conductive semiconductor layer is doped with n-type dopant with an density of $1 \times 10^{18}/cm^3$ or more.

8. The light emitting device as claimed in claim 1, wherein the roughness layer comprises an indium dot as the dot shape and comprises a thickness of 1000 Å to 1900 Å.

9. The light emitting device as claimed in claim 1,
   wherein the third conductive semiconductor layer has a rough surface on the roughness layer, and
   wherein the third conductive semiconductor layer is formed of a different material from a material of the roughness layer.

10. The light emitting device as claimed in claim 1, comprising a transparent electrode layer on the third conductive semiconductor layer.

11. A light emitting device, comprising:
    a first conductive semiconductor layer;
    an active layer on the first conductive semiconductor;
    a second conductive semiconductor layer on the active layer;
    a roughness layer including a dot shape on the second conductive semiconductor layer,
    a third conductive semiconductor layer on the roughness layer; and
    a second electrode on the third conductive semiconductor layer,
    wherein the roughness layer is disposed between the third conductive semiconductor layer and the second conductive semiconductor layer, and the third conductive semiconductor layer is disposed between the second electrode and the roughness layer, and
wherein the roughness layer is formed of an indium dot as the dot shape.

12. A light emitting device, comprising:
a first conductive semiconductor layer;
an active layer on the first conductive semiconductor;
a second conductive semiconductor layer on the active layer;
a roughness layer including a dot shape on the second conductive semiconductor layer,
a third conductive semiconductor layer on the roughness layer; and
a second electrode on the third conductive semiconductor layer,
wherein the roughness layer is disposed between the third conductive semiconductor layer and the second conductive semiconductor layer, and the third conductive semiconductor layer is disposed between the second electrode and the roughness layer,
wherein the third conductive semiconductor layer comprises a first cap layer on the roughness layer, and a second cap layer comprising a superlattice layer on the first cap layer, and
wherein the superlattice layer comprises at least two layers alternatively stacked, the at least two layers being selected from the group consisting of AlInGaN, InGaN, GaN, AlInN and AlN.

13. The light emitting device as claimed in claim 12, wherein the first cap layer comprises a thickness of 1 nm to 10 nm and the second cap layer comprises a thickness of 1 nm to 100 nm.

14. The light emitting device as claimed in claim 12, comprising a first electrode electrically connected to the first conductive semiconductor layer, and a transparent electrode layer on the third conductive semiconductor layer.

15. The light emitting device as claimed in claim 14, wherein the transparent electrode layer comprises at least one of the ITO, ZnO, IrOx, RuOx and NiO.

16. A light emitting device, comprising:
a first conductive semiconductor layer;
an active layer on the first conductive semiconductor;
a second conductive semiconductor layer on the active layer;
a roughness layer including a dot shape on the second conductive semiconductor layer,
a third conductive semiconductor layer on the roughness layer; and
a second electrode on the third conductive semiconductor layer,
wherein the roughness layer is disposed between the third conductive semiconductor layer and the second conductive semiconductor layer, and the third conductive semiconductor layer is disposed between the second electrode and the roughness layer, and
wherein the second electrode comprises at least one layer including material selected from the group consisting of Ag, Ni, Al, Rh, Pd, Ir, Ru, Mg, Zn, Pt, Au and Hf, and combinations thereof.

17. The light emitting device as claimed in claim 11, wherein the third conductive semiconductor layer comprises a plurality of semiconductor layers and an upper surface of the third conductive semiconductor layer is rough.

18. The light emitting device as claimed in claim 17, wherein at least one layer of the plurality of semiconductor layers of the third conductive semiconductor layer is formed of a semiconductor having a polarity the same as a polarity of the first conductive semiconductor layer.

* * * * *